(12) United States Patent
Lee et al.

(10) Patent No.: US 11,715,729 B2
(45) Date of Patent: Aug. 1, 2023

(54) DISPLAY MODULE AND METHOD OF MANUFACTURING THE SAME

(71) Applicant: SAMSUNG ELECTRONICS CO., LTD., Suwon-si (KR)

(72) Inventors: Yoonsuk Lee, Suwon-si (KR); Eunhye Kim, Suwon-si (KR); Sangmoo Park, Suwon-si (KR); Dongyeob Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 28 days.

(21) Appl. No.: 17/244,471

(22) Filed: Apr. 29, 2021

(65) Prior Publication Data

US 2021/0358896 A1      Nov. 18, 2021

(30) Foreign Application Priority Data

May 14, 2020   (KR) ........................ 10-2020-0057580

(51) Int. Cl.
*H01L 25/16*    (2023.01)
*H01L 23/00*    (2006.01)
*H01L 33/40*    (2010.01)

(52) U.S. Cl.
CPC ............ *H01L 25/167* (2013.01); *H01L 24/26* (2013.01); *H01L 24/32* (2013.01); *H01L 24/83* (2013.01);
(Continued)

(58) Field of Classification Search
None
See application file for complete search history.

(56) References Cited

U.S. PATENT DOCUMENTS 9,178,123 B2   11/2015   Sakariya et al.
10,008,610 B2   6/2018   Park
(Continued)

FOREIGN PATENT DOCUMENTS

CN   203950289 U   * 11/2014   ......... G02F 1/13338
CN   204087149 U   *  1/2015
(Continued)

OTHER PUBLICATIONS

International Search Report dated Jul. 8, 2021 issued by the International Searching Authority in International Application No. PCT/KR2021/004487 (PCT/ISA/210).
(Continued)

*Primary Examiner* — Telly D Green
(74) *Attorney, Agent, or Firm* — Sughrue Mion, PLLC

(57) ABSTRACT

A display module and a method for manufacturing thereof are provided. The display module includes a glass substrate; a thin film transistor (TFT) layer provided on a surface of the glass substrate, the TFT layer including a plurality of TFT electrode pads; a plurality of light emitting diodes (LEDs) provided on the TFT layer, each of the plurality of LEDs including LED electrode pads that are electrically connected to respective TFT electrode pads among the plurality of TFT electrode pads; and a light shielding member provided on the TFT layer and between the plurality of LEDs, wherein a height of the light shielding member with respect to the TFT layer is lower than a height of the plurality of LEDs with respect to the TFT layer.

14 Claims, 13 Drawing Sheets

(52) U.S. Cl.
CPC .............. *H01L 24/05* (2013.01); *H01L 24/29* (2013.01); *H01L 33/40* (2013.01); *H01L 2224/05639* (2013.01); *H01L 2224/05644* (2013.01); *H01L 2224/05647* (2013.01); *H01L 2224/05655* (2013.01); *H01L 2224/08501* (2013.01); *H01L 2224/26145* (2013.01); *H01L 2224/29105* (2013.01); *H01L 2224/29109* (2013.01); *H01L 2224/29111* (2013.01); *H01L 2224/29113* (2013.01); *H01L 2224/29118* (2013.01); *H01L 2224/29124* (2013.01); *H01L 2224/29139* (2013.01); *H01L 2224/29147* (2013.01); *H01L 2224/29155* (2013.01); *H01L 2224/29386* (2013.01); *H01L 2224/29393* (2013.01); *H01L 2224/32145* (2013.01); *H01L 2224/32501* (2013.01); *H01L 2224/83203* (2013.01)

(56) References Cited

U.S. PATENT DOCUMENTS

| | | | |
|---|---|---|---|
| 10,367,128 | B2 | 7/2019 | Li et al. |
| 10,424,567 | B2 | 9/2019 | Kim |
| 10,930,789 | B2 | 2/2021 | Park |
| 11,063,026 | B2 * | 7/2021 | Kim ..................... H01L 33/62 |
| 2017/0062514 | A1 | 3/2017 | Park |
| 2017/0309604 | A1 | 10/2017 | Kim |
| 2018/0269328 | A1 | 9/2018 | Park |
| 2018/0277591 | A1 * | 9/2018 | Wu ......................... H01L 33/60 |
| 2019/0164854 | A1 | 5/2019 | Liu et al. |
| 2019/0244937 | A1 * | 8/2019 | Honjo ..................... G02B 5/20 |
| 2020/0083283 | A1 * | 3/2020 | Lee ..................... H01L 25/0753 |
| 2020/0312822 | A1 * | 10/2020 | Kim ..................... H01L 25/0753 |
| 2020/0373282 | A1 * | 11/2020 | Liu ....................... H01L 25/167 |

FOREIGN PATENT DOCUMENTS

| | | |
|---|---|---|
| JP | 2008-112833 A | 5/2008 |
| KR | 101842585 B1 * | 12/2010 |
| KR | 10-2013-0137985 A | 12/2013 |
| KR | 10-2017-0026954 A | 3/2017 |
| KR | 10-2017-0120245 A | 10/2017 |
| KR | 10-1837362 B1 | 4/2018 |
| KR | 10-2018-0067447 A | 6/2018 |
| KR | 10-2019-0004136 A | 1/2019 |
| KR | 10-2019-0126260 A | 11/2019 |
| KR | 10-2019-0131546 A | 11/2019 |
| TW | 202016622 A | 5/2020 |

OTHER PUBLICATIONS

Written Opinion dated Jul. 8, 2021 issued by the International Searching Authority in International Application No. PCT/KR2021/004487 (PCT/ISA/237).

* cited by examiner

DISPLAY MODULE AND METHOD OF MANUFACTURING THE SAME

CROSS-REFERENCE TO RELATED APPLICATION

This application is based on and claims priority under 35 U.S.C. § 119 to Korean Patent Application No. 10-2020-0057580, filed on May 14, 2020, in the Korean Intellectual Property Office, the disclosure of which is incorporated by reference herein in its entirety.

BACKGROUND

1. Field

The disclosure relates to a display module and a method for manufacturing a display module, and more particularly to a display module that prevents a deviation of a micro LED in a bonding process and has a stable electrical and physical bonding structure between a micro LED and a TFT layer, and an associated method of manufacturing.

2. Description of Related Art

Light emitting diodes (LED) are widely used as light sources for lighting devices, and also as light sources for various display devices of various electronic products such as a TV, a mobile phone, a PC, a notebook PC, a PDA, and the like.

In particular, a micro LED having a size of 100 µm or less is being developed, and the micro LED has a higher reaction speed, lower power, and high luminance compared to the LED of the related art. Such a micro LED may be transferred onto a target substrate to provide a display module.

The mounting equipment using laser transfer of the related art loads a transfer substrate and a target substrate on upper and lower stages, respectively, and performs alignment between the transfer substrate and the target substrate. When the alignment is completed, the upper and lower stages are driven and the LED is transferred to the target substrate by emitting a laser beam to the transfer substrate when the transfer substrate and the target substrate approach a laser beam emission position.

An LED display device of the related art is manufactured as a modular display which forms one screen by combining a plurality of unit LED modules (or unit LED panels). For each of the LED modules, a transfer substrate with a group of red, green, and blue LED chips is transferred to the LED module using surface mount technology (SMT) equipment.

Since it is necessary to transfer a micro LED chip for manufacturing a micro-pitch display, the LED module of the related art is manufactured by a method of transferring a plurality of LED chips using a laser transfer method or a stamp transfer method.

In this case, the LED chips are bonded to a TFT substrate using an adhesive material for electric connection between the LED chip and the TFT substrate. However, in this bonding process, the LED chip is deviated from the transferred position due to a pressure applied to the LED chip.

SUMMARY

Provided is a display module that prevents a deviation of a micro LED in a bonding process by providing a light shielding member on a TFT layer before transferring the micro LED and a method for manufacturing the same.

Provided also is a display module having a stable electrical and physical bonding structure between a micro LED and a TFT layer, and a method for manufacturing the same.

According to an aspect of the disclosure, there is provided a display module including: a glass substrate; a thin film transistor (TFT) layer provided on a surface of the glass substrate, the TFT layer including a plurality of TFT electrode pads; a plurality of light emitting diodes (LEDs) provided on the TFT layer, each of the plurality of LEDs including LED electrode pads that are electrically connected to respective TFT electrode pads among the plurality of TFT electrode pads; and a light shielding member provided on the TFT layer and between the plurality of LEDs, wherein a height of the light shielding member with respect to the TFT layer is lower than a height of the plurality of LEDs with respect to the TFT layer.

The light shielding member may have a plurality of openings for individually isolating the plurality of LEDs, and the LED electrode pads and the plurality of TFT electrode pads may be electrically and physically connected to each other by an adhesive applied to the plurality of openings.

The height of the light shielding member with respect to the TFT layer may be higher than a height of the TFT electrode pads with respect to the TFT layer.

A size of each of the plurality of openings may be larger than a size of each of the plurality of LEDs.

The light shielding member may have a mesh structure.

The light shielding member may include a photosensitive resin composition including a binder resin, a photopolymerization initiator, a black pigment, and a solvent; or a resin composition including a black pigment for shielding.

The adhesive may include flux particles, and the flux particles may include one or more of: an inorganic flux containing zinc chloride and zinc chloride-ammonia chloride; an organic flux containing glutamic acid hydrochloride urea and ethylene diamine stearic acid hydrochloride; a rosin-based flux containing inactive/active rosin; or a water-soluble flux containing salt, acid, and amine.

The adhesive may include anisotropic conductive paste or an anisotropic conductive film.

The adhesive may include a non-conductive paste or a non-conductive film.

Each of the LED electrode pads may include a stacked structure of a first layer and a second layer, the first layer may include one of Au, Cu, Ni, or Al, and the second layer may include one of Au, Ni, Ti, Cr, Pd, TiN, Ta, TiW, TaN, AlSiTiN, NiTi, TiBN, ZrBN, TiAlN, or TiB2.

The TFT electrode pads may include one of Au, Cu, Ag, Ni, Ni/Au, Au/Ni, Ni/Cu, or Cu/Ni.

The adhesive may be melted together with the second layer of the LED electrode pads and the TFT electrode pads to form a metal compound.

The adhesive may consist essentially of Sn or In.

The adhesive may include two or more of Sn, Ag, In, Cu, Ni, Au, Cu, Bi, Al, Zn, or Ga.

According to an aspect of the disclosure, there is provided a display module including: a glass substrate; a thin film transistor (TFT) layer provided on a surface of the glass substrate, the TFT layer including a plurality of TFT electrode pads; a plurality of light emitting diodes (LEDs) provided on the TFT layer, each of the plurality of LED including LED electrode pads that are electrically connected to respective electrode pads among the plurality of TFT electrode pads; a light shielding member provided on the TFT layer as a mesh structure having a plurality of openings, the light shielding member having a height with respect to the TFT layer that is lower than a height of the plurality of LEDs with respect to the TFT layer; and an adhesive provided in the plurality of openings and electrically and physically connecting the LED electrode pads and the plurality of TFT electrode pads to each other.

The adhesive may include one of anisotropic conductive paste, anisotropic conductive film, non-conductive paste, or non-conductive film.

According to an aspect of the disclosure, there is provided a method for manufacturing a display module, the method including: providing a TFT layer on a surface of a glass substrate, the TFT layer including a plurality of TFT electrode pads; providing, on the TFT layer, a light shielding member having a plurality of openings for individually isolating the plurality of TFT electrode pads of the TFT layer; applying an adhesive to the plurality of openings to cover the plurality of TFT electrode pads; transferring a plurality of light emitting diodes (LEDs) onto the TFT layer in the plurality of openings; and bonding LED electrode pads of the plurality of LEDs and the plurality of TFT electrode pads to each other with the adhesive by heat pressing the plurality of LEDs towards the TFT layer.

A height of the light shielding member with respect to the TFT layer may be lower than a height of the plurality of LEDs with respect to the TFT layer.

The plurality of LEDs may be pressed by a pressurization member at a uniform pressure.

The bonding may include bonding the LED electrode pads and the plurality of TFT electrode pads together with the adhesive in a metal bonding state.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
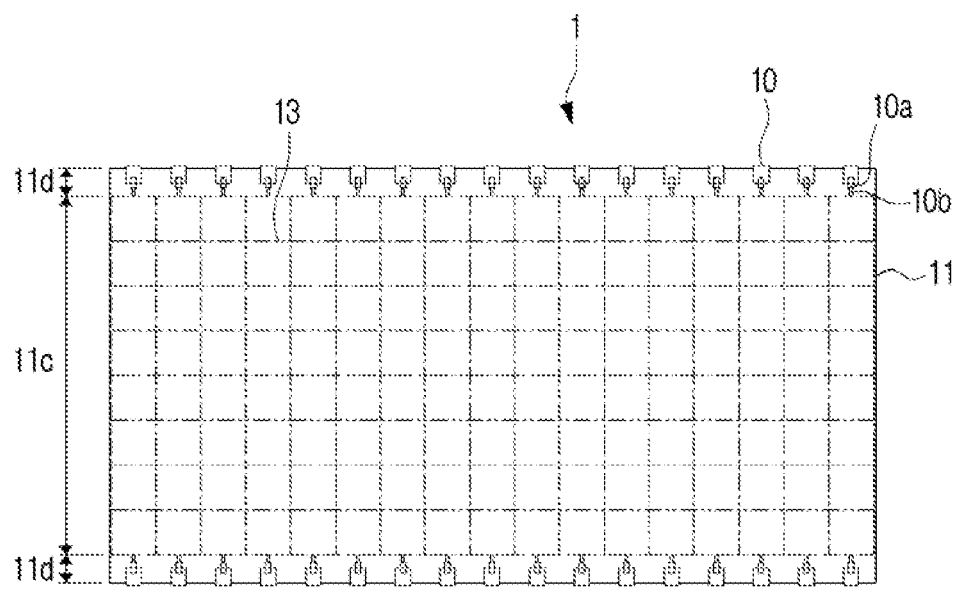
FIG. 1 is a plan view of a display module according to an embodiment.

Hereinafter, various embodiments will be described in more detail with reference to the accompanying drawings. The embodiments disclosed in the specification may be variously changed. A specific embodiment may be illustrated in the drawing and described in detail in the detailed description. However, the specific embodiment disclosed in the accompanying drawing is merely for easy understanding of various embodiments. Accordingly, it should be understood that the technical spirit is not limited to the specific embodiment disclosed in the accompanying drawing, and all equivalents or alternatives included in the disclosed spirit and technical scope are included.

The terms including ordinals such as "first" or "second" may be used for describing various components, but the components are not limited by the above terms. The above terms may be only used for distinguishing one component from another.

It is to be understood that the terms such as "comprise," "include," or "consist of" are used herein to designate a presence of characteristic, number, step, operation, element, part, or a combination thereof, and not to preclude a presence or a possibility of adding one or more of other characteristics, numbers, steps, operations, elements, parts or a combination thereof. It is to be understood that the singular forms "a," "an," and "the" include plural references unless the context clearly dictates otherwise.

In the below description, a detailed description of the related art or configuration may be omitted when it is determined that the detailed description may unnecessarily obscure a gist of the disclosure.

According to an embodiment, a thin film transistor (TFT) layer formed with a TFT circuit may be disposed on a front surface of a glass substrate, and a driving circuit for driving the TFT circuit of the TFT layer may be disposed on a rear surface of the glass substrate. The glass substrate may be provided in a quadrangle shape. Specifically, the glass substrate may be provided in a rectangle or square shape.

According to an embodiment, a substrate obtained by laminating the TFT layer (or backplane) on the glass substrate may refer to a TFT substrate. The TFT substrate is not limited to a specific structure or type. For example, the TFT substrate may be implemented as a low temperature polycrystalline silicon (LTPS) TFT, an oxide TFT, an Si TFT (poly silicon, a-silicon), an organic TFT, a graphene TFT, and the like, or only a P-type (or N-type) metal oxide semiconductor field effect transistor (MOSFET) may be manufactured in an Si wafer complementary metal oxide semiconductor (CMOS) process and applied.

According to an embodiment, a front surface of the glass substrate on which the TFT layer is disposed may be divided into an active region and an inactive region. The active region may correspond to a region occupied by the TFT layer on one surface of the glass substrate and the inactive region may correspond to an edge region on one surface of the glass substrate.

According to an embodiment, the edge region of the glass substrate may include a side surface of the glass substrate. In addition, the edge region of the glass substrate may be a remaining region excluding the region on the front surface of the glass substrate in which the TFT circuit is disposed, and the region on the rear surface of the glass substrate in which the driving circuit is disposed. Further, the edge region of the glass substrate may include the side surface of the glass substrate, and a part of the front surface of the glass substrate and a part of the rear surface of the glass substrate adjacent to the side surface.

According to an embodiment, on the glass substrate, a plurality of front surface connection pads electrically connected to the TFT circuit via wires may be provided in the edge region of the front surface, and a plurality of rear surface connection pads electrically connected to the driving circuit via wires may be provided in the edge region of the rear surface. The plurality of front surface and rear surface connection pads may be disposed away from the side surface of the glass substrate towards the front or rear surfaces of the glass substrate by a certain distance, respectively. The connection pads provided respectively on the front surface and the rear surface of the glass substrate may be electrically connected via side wirings provided in the edge region of the glass substrate.

According to an embodiment, a plurality of pixels may be provided on the TFT layer of the glass substrate. Each pixel may include a plurality of subpixels, and one subpixel may correspond to one micro LED. The TFT layer may include a TFT circuit for driving each pixel. The micro LED may be a semiconductor chip which includes an inorganic light emitting material and emits light by itself, if power is supplied. In addition, the micro LED may have a flip chip structure in which anode and cathode electrodes are provided on the same surface and a light emitting surface is provided on a side opposite to the above electrodes.

According to an embodiment, the TFT layer may be stacked on the glass substrate and electrically connected to the micro LED. Specifically, an electrode pad of the micro LED may be electrically connected to an electrode pad on the TFT layer, and the electrode of the micro LED and the TFT electrode may have a bonding structure in a metal bonding state.

According to an embodiment, a display module including a micro light emitting diode (micro LED or μLED) may be a flat display panel. The micro LED may be an inorganic light emitting diode (inorganic LED) having a size of 100 μm or less. As described above, the display module including the micro LED may provide better contrast, faster response time, and higher energy efficiency than those of a liquid crystal display (LCD) panel which needs a backlight. Both an organic light emitting diode (OLED) and the micro LED, which is inorganic light emitting element, have excellent energy efficiency. However, the micro LED has better brightness, light emitting efficiency, and life time, compared to the OLED.

According to an embodiment, the display module may form a black matrix between a plurality of micro LEDs arranged on the TFT layer. The black matrix may enhance a contrast ratio by shielding leakage of light from a surrounding portion of the micro LEDs adjacent to each other.

According to an embodiment, the display module may further include a touch screen panel disposed on a side where the plurality of micro LEDs emit light, and in this case, the display module may include a touch screen driving unit for driving the touch screen panel. In addition, the display module may further include a rear substrate which is disposed on the rear surface of the glass substrate and electrically connected via a flexible printed circuit (FPC) or the like. In addition, the display module may further include a communication device capable of receiving data.

As described above, a glass substrate in which the micro LED is mounted and side wirings are provided may refer to a display module. The display module may be installed and applied on a wearable device, a portable device, a handheld device, and various electronic products or electronic devices in which displays are necessary, in a single unit. The display module may be applied to a display device such as a personal computer (PC) monitor, a high-definition TV and signage (or digital signage), and an electronic display through a plurality of assemblies and arrangements in a matrix type.

Hereinafter, a display module according to an embodiment will be described in detail with reference to the drawings.

Figure 2:
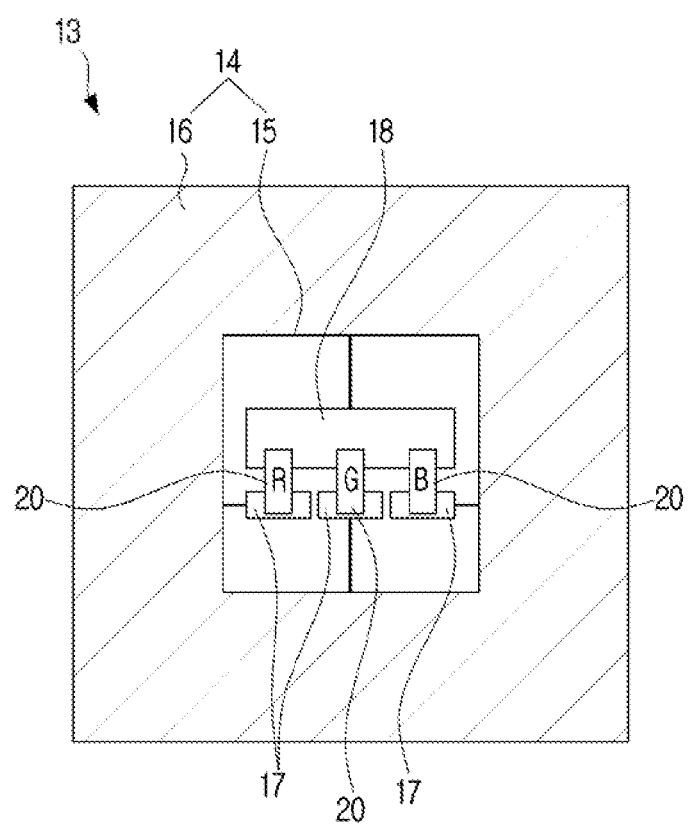
FIG. 2 is a schematic view of pixels arranged on a TFT layer.
Figure 3:
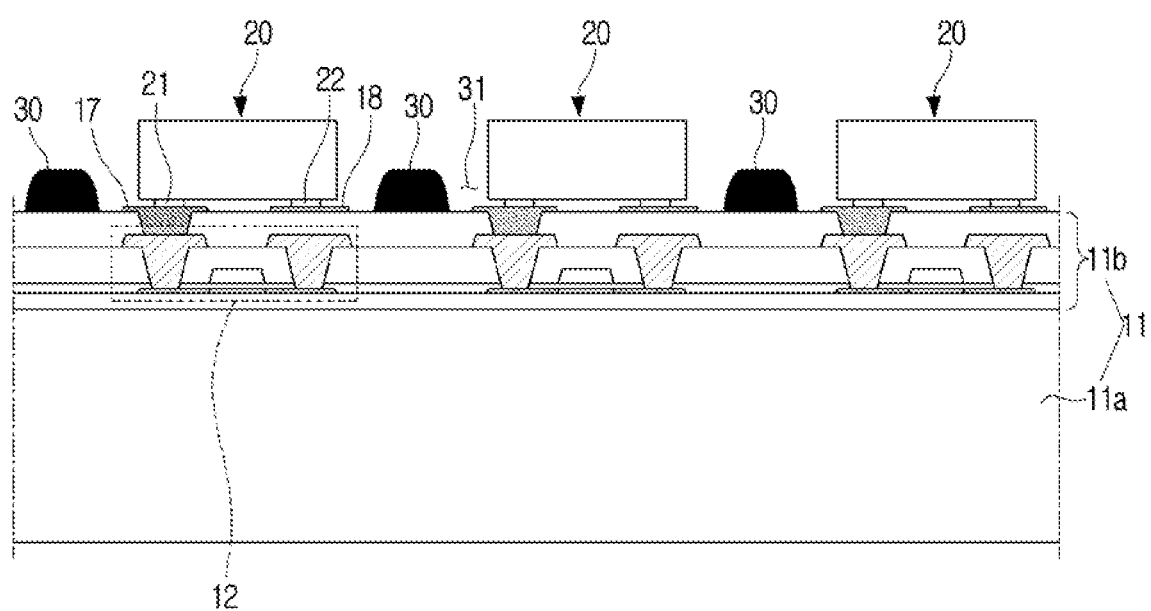
FIG. 3 is a cross-sectional view of a display module according to an embodiment.

FIG. 1 is a plan view schematically illustrating a display module according to an embodiment, FIG. 2 is a schematic view illustrating pixels arranged on a TFT layer, and FIG. 3 is a cross-sectional view schematically illustrating a display module according to an embodiment. In FIG. 3, an adhesive member 50 is not illustrated for convenience of description.

Referring to FIGS. 1 to 3, a display module 1 may include a TFT substrate 11.

The display module 1 may include a plurality of micro LEDs 20 transferred onto the TFT substrate 11. The TFT substrate 11 may include a glass substrate 11a, a TFT layer 11b including a TFT circuit 12 on a front surface of the glass substrate 11a, and a plurality of side wirings 10 for electrically connecting the TFT circuit of the TFT layer 11b and circuits disposed on the rear surface of the glass substrate 11a. The TFT substrate 11 may include an active region 11c for expressing an image on the front surface and an inactive region 11d in which an image may not be expressed.

The active region 11c may be partitioned into a plurality of pixel regions 13 in which a plurality of pixels 20 are arranged, respectively.

The plurality of pixel regions 13 may be partitioned in various forms and may be, for example, partitioned in a matrix form. Each pixel region 13 may include a subpixel region 15 in which a plurality of pixels, which may include a red LED, a green LED, and a blue LED, are mounted, and a pixel circuit region 16 for driving each subpixel.

The plurality of micro LEDs 20 may be transferred to the pixel circuit region 16 of the TFT layer 11b and the electrode pads of each micro LED may be electrically connected to electrode pads 17 and 18 provided on the TFT layer 11b. The common electrode pad 18 may be formed linearly in consideration of arrangement of the three micro LEDs 20 arranged in a line.

A pixel driving method of the display module 1 according to an embodiment may be an active matrix (AM) driving method or a passive matrix (PM) driving method. The display module 1 may form a pattern of a wire electrically connected to each micro LED according to the AM driving method or the PM driving method.

The inactive region 11d may correspond to the edge region of the TFT substrate 11 and a plurality of connection pads 10a may be disposed at regular intervals.

In the TFT substrate 11, the plurality of connection pads 10a may be provided at intervals in the inactive region 11d. Each of the plurality of connection pads 10a may be electrically connected to each subpixel (micro LED) via a wire 10b. The plurality of connection pads 10a may be disposed on each of the edge region of the front surface of the TFT substrate 11 and the edge region of the rear surface of the TFT substrate.

The number of connection pads 10a provided in the inactive region 11d may vary depending on the number of pixels implemented on the glass substrate and may vary depending on the driving method of the TFT circuit disposed in the active region 11c. For example, in the AM driving method for driving each pixel individually, a larger number of wires and connection pads may be needed, compared to a case of the PM driving method in which the TFT circuit disposed in the active region 11c drives the plurality of pixels in horizontal lines and vertical lines.

FIG. 1 shows an example in which the side wirings 10 are disposed on both of long sides of the TFT substrate 11, but there is no limitation thereto, and the side wirings 10 may be disposed along both of short sides of the TFT substrate 11, disposed along one long side and one short side of the TFT substrate 11, or disposed only along one long side of the TFT substrate 11.

For convenience, FIG. 3 only illustrates two subpixels among the micro LEDs 20 which are three subpixels included in a unit pixel.

The display module 1 may include a transparent cover layer for protecting the plurality of micro LEDs 20 on the front surface. In this case, a touch screen panel may be stacked on the front surface of the transparent cover layer.

The plurality of micro LEDs 20 may be semiconductor chips which are formed of an inorganic light emitting material that emit light by themselves, if power is supplied.

The plurality of micro LEDs 20 may be shaped as a square having a predetermined thickness and the same width and length, or as rectangles having different width and length. With such micro LEDs, real high dynamic range (HDR) may be implemented, luminance and black expression may be improved, and higher contrast ratio may be provided, compared to OLED. A size of the micro LED may be 100 μm or less or 30 μm or less.

The plurality of micro LEDs 20 may have a flip chip structure in which anode and cathode electrodes are provided on the same surface, and a light emitting surface is provided on a side opposite to the above electrodes.

The display module 1 may include a light shielding member 30 for isolating each of the plurality of micro LEDs 20. The light shielding member 30 may be provided before the micro LEDs 20 are transferred to the TFT layer 11b.

The light shielding member 30 may be disposed adjacent to each other and disposed between the micro LEDs which emit light with different colors to block color smear occurring due to mixing of different colors. In addition, the light shielding member 30 may enhance a contrast ratio by absorbing external light, since it may be black.

The light shielding member 30 may be a black matrix. In addition, the light shielding member 30 may include a photosensitive resin composition including a binder resin, a photopolymerization initiator, a black pigment, and a solvent, or a resin composition including a black pigment for shielding.

The light shielding member 30 may be provided on the TFT layer 11b in advance before the micro LEDs 20 are transferred to the TFT layer 11b. As described above, the light shielding member 30 may be formed while the micro LEDs are not provided on the TFT layer 11b, and accordingly, the light shielding member 30 may be easily added to the TFT layer 11b and malfunction of the light shielding member 30 may be easily obtained.

The light shielding member 30 may include a plurality of openings 31 arranged in a matrix form. Each opening 31 may correspond to TFT electrode pads 17 and 18 of the TFT layer 11b. One micro LED 20 may be disposed on each opening 31. Accordingly, the number of TFT electrode pads 17 and 18 surrounded by one opening 31 may correspond to the number of LED electrode pads 21 and 22 of one micro LED. For example, when the LED electrode pads 21 and 22 of one micro LED are a pair, the TFT electrode pads 17 and 18 corresponding thereto may also be a pair.

The opening 31 may be larger than the size (or area) of one micro LED 20. Accordingly, when the micro LED 20 is disposed in the opening 31, a side surface 20b (see FIG. 10) of the micro LED and an inner end of the opening 31 may maintain a predetermined distance. According to an embodiment, a shape of the opening 31 may correspond to the shape of the micro LED 20.

A height H1 (see FIG. 10) of the light shielding member 30, with respect to the TFT layer 11b, may be lower than a height H4 (see FIG. 10) of the micro LED transferred to the TFT layer 11b, with respect to the TFT layer 11b, due to the following reason.

Since the light shielding member 30 may be provided on the TFT layer 11b before the transfer process of the micro LED 20, an interference between the micro LED 20 arranged on a transfer substrate 170 (see FIG. 13) and the light shielding member 30 when moving the transfer substrate 170 to a predetermined position in the transfer process may be minimized. In this case, the micro LEDs 20 arranged on the transfer substrate 170 may be disposed oppose to the TFT layer 11b of a target substrate 180. The target substrate 180 may refer to the TFT substrate 11 before the micro LED 20 is transferred.

In addition, after the transfer process, a bonding process through heat pressing may be performed in order to physically and electrically connecting the LED electrode pads 21 and 22 of the micro LED and the TFT electrode pads 17 and 18 of the TFT layer 11b. In the heat pressing, the plurality of micro LEDs 20 transferred to the target substrate 180 may be pressed against the TFT layer 11b with a pressurization member 60 (see FIG. 10) at a predetermined pressure at a predetermined temperature (such as a high temperature). The pressurization member 60 may have a pressurization surface 61 (see FIG. 10) which is formed substantially flat so as to evenly pressurize the plurality of micro LEDs 20 at the same time.

At the time of the heat pressing, if an upper surface of the light shielding member 30 comes into contact with the pressurization surface 61 of the pressurization member 60 before the an upper surface 20a (see FIG. 10) of the micro LED 20, the pressurization with respect to the micro LED 20 may not be performed properly. As a result, the LED electrode pads 21 and 22 and the TFT electrode pads 17 and 18 may not be bonded to each other strongly. Therefore, the height H1 of the light shielding member 30 may be lower than the height H4 of the micro LED transferred to the TFT layer 11b so that the pressurization member 60 moving towards the micro LED 20 is able to pressurize the upper surface of the micro LED without being interfered by the light shielding member 30.

The plurality of micro LEDs 20 may be guided by the light shielding member 30 so as not to be deviated from the transferred position (or bonding position) due to the pressure applied by the pressurization member 60 during the heat pressing.

An adhesive member 50 (see FIG. 10) may electrically and physically connect the LED electrode pads 21 and 22 of the micro LED 20 to the plurality of TFT electrode pads 17 and 18 provided on the TFT layer 11b. According to an embodiment, the adhesive member 50 may be a soldering member.

The adhesive member 50 may be applied to each of the plurality of openings 31 of the light shielding member 30 by a dispenser. In this case, the adhesive member 50 may be applied so as to cover the TFT electrode pads 17 and 18 surrounded by the plurality of openings 31. The adhesive member 50 may melt to have a predetermined fluidity during the heat pressing of the plurality of micro LEDs 20 against the TFT layer 11b and thus, the shape thereof may be slightly changed. The adhesive member 50 may be electrically and physically connect the LED electrode pads 21 and 22 of the micro LED and the TFT electrode pads 17 and 18 to each other.

The adhesive member 50 may have a fluxing function. The fluxing function may, when melting the adhesive member 50, reduce a part of the oxidized surface of the adhesive member by flux particles again and pushing a coating film out by the melted adhesive member at the same time, thereby preventing oxidation of the adhesive member.

The flux particles may cover the surface of the adhesive member 50 to prevent oxidation of the adhesive member 50 by isolating the surface of the adhesive member 50 from external oxygen. The flux particles may include various fluxes such as an inorganic flux containing zinc chloride and zinc chloride-ammonia chloride, an organic flux containing glutamic acid hydrochloride urea and ethylene diamine stearic acid hydrochloride, a rosin-based flux containing inactive/active rosin, and a water-soluble flux containing salt, acid, and amine.

For the adhesive member 50, an organic acid, such as dibasic acid having an alkyl group in a side chain, may be selected in order to enhance the fluxing function. The dibasic acid is not particularly limited, but the number of carbon atoms may be 6 or more. As an alkyl group selected to constitute the side chain, a low-order alkyl group having 1 to 5 carbon atoms may be selected. The number of alkyl groups selected to constitute the side chain may be one or more. If a plurality of alkyl groups are contained in a molecule of organic acid, these alkyl groups may be the same or different.

The adhesive member 50 may be formed by mixing the flux particles into a thermosetting resin material. Main components of the thermosetting resin may include an epoxy resin, a phenol resin, a polyimide resin, a polyurethane resin, a melamine resin, and a urea resin. The thermosetting resin may include the above resins or a mixture of two or more of the above resins. In addition, for the thermosetting resin, a resin that is liquid at room temperature may be selected, and if a solid resin is selected, the solid resin may be used in combination with a resin that is liquid at room temperature.

The adhesive member 50 may be constituted with a non-conductive material in which fine conductive particles are disposed. For example, the adhesive member may be anisotropic conductive paste (ACP) or an anisotropic conductive film (ACF). The ACP may be an anisotropic conductive material obtained by mixing fine conductive particles with an adhesive resin to be conductive only in one direction while maintaining adhesiveness. The ACF may be an anisotropic conductive film obtained by mixing fine conductive particles with an adhesive resin in a form of a film to be conductive only in one direction.

The adhesive member 50 may include a polymer material containing conductive particles in nanometer scale or micrometer scale. The conductive particles may be one of metal particles of Ni, Cu, or the like, carbon particles, a solder ball, a polymer ball coated with metal, and the like. The conductive particles may be disposed to be aligned or randomly in the non-conductive material.

The adhesive member 50 may fill a space S (see FIG. 10) provided between the LED electrode pads 21 and 22 and the TFT electrode pads 17 and 18. The non-conductive material of the adhesive member 50 may fills the space S, and the LED electrode pads 21 and 22 adjacent to each other and the TFT electrode pads 17 and 18 adjacent to each other may be insulated from each other to prevent occurrence of electrical short. Accordingly, the adhesive member 50 may prevent the occurrence of electrical short while electrically connecting the micro LED 20 to the TFT layer 11b.

The adhesive member 50 may surround the side surface 20b of the micro LED 20 to physically fix the micro LED 20 onto the TFT layer 11b and provide stability. Therefore, when an impact is applied to the display module 1, the adhesive member 50 may prevent the micro LED 20 from being separated from the TFT layer 11b. The adhesive member 50 may prevent optical attenuation, since it does not cover the light emitting surface which is an upper surface 21a of the micro LED while strongly fixing the micro LED 20.

In addition, the adhesive member 50 may be NCP or a NCF having both flux function and underfill function. In this case, the adhesive member 50 may form a protrusion on the surface of the TFT electrode pads 17 and 18, and may be cured by a non-conductive thermosetting resin while preventing sliding when coming into contact with the LED electrode pads 21 and 22.

The LED electrode pads 21 and 22 and the TFT electrode pads 17 and 18 connected thereto may be connected to each other in a metal bonding state when performing the heat pressing of the plurality of micro LEDs. The "metal bonding state" may imply that a new inter-metallic compound (IMC) is formed by a reaction between a metal material forming the LED electrode pads 21 and 22 and a metal material forming the TFT electrode pads 17 and 18 due to heating. The metal bonding state may be provided by a transient liquid phase (TLP) bonding process.

The LED electrode pads and the TFT electrode pads bonded to each other by the TLP bonding process may significantly reduce a change in shape after the bonding, and thus, the bonding may be easily performed even with dissimilar metals having different thicknesses or different physical properties and a heat affected zone is small. Therefore, it is possible to provide more reliable bonding between the LED electrode pads and the TFT electrode pads having a micro size of 100 µm or less.

Figure 10:
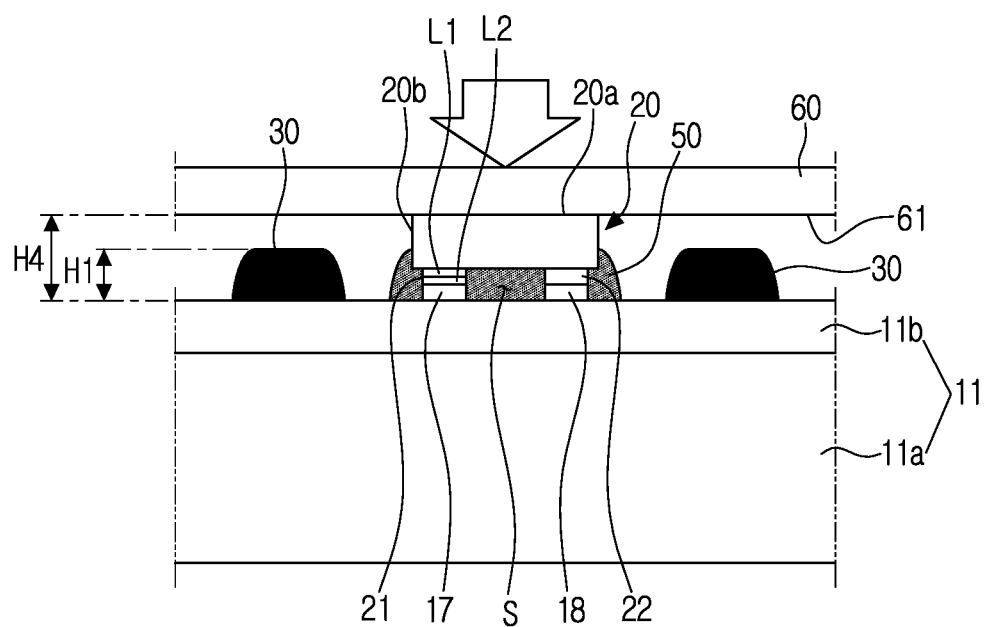
FIG. 10 is a sequential schematic view of the method for manufacturing the display module according to an embodiment.

Each of the LED electrode pads 21 and 22 may have first and second stacked layers L1 and L2 (see, e.g., FIG. 10). The first layer L1 may reduce contact resistance between a p-type semiconductor layer and the second layer of the micro LED to enhance adhesiveness between the p-type semiconductor layer and the second layer. The first layer L1 may include any one material of Au, Cu, Ni, and Al. The second layer L2 may include any one material of Au, Ni, Ti, Cr, Pd, TiN, Ta, TiW, TaN, AlSiTiN, NiTi, TiBN, ZrBN, TiAlN, and TiB2. The TFT electrode pads 17 and 18 may include a single layer and may include any one of Au, Cu, Ag, Ni, Ni/Au, Au/Ni, Ni/Cu, and Cu/Ni.

The adhesive member 50 may include Sn or In, or may include a composition of at least two or more of Sn, Ag, In, Cu, Ni, Au, Cu, Bi, Al, Zn, and Ga so as to smoothly bond the second layer and the TFT electrode pads 17 and 18.

According to an embodiment, the TFT electrode pads 17 and 18 may have a multilayer stacked structure, if a specific material (e.g., Ni or Cu) is added in the manufacturing process, and then, the multilayer structure of the TFT electrode pads 17 and 18 may be changed to a single layer structure formed of the compound by the heat treatment process.

Hereinafter, a method for manufacturing the display module according to an embodiment will be described with reference to the drawings.

Figure 4:
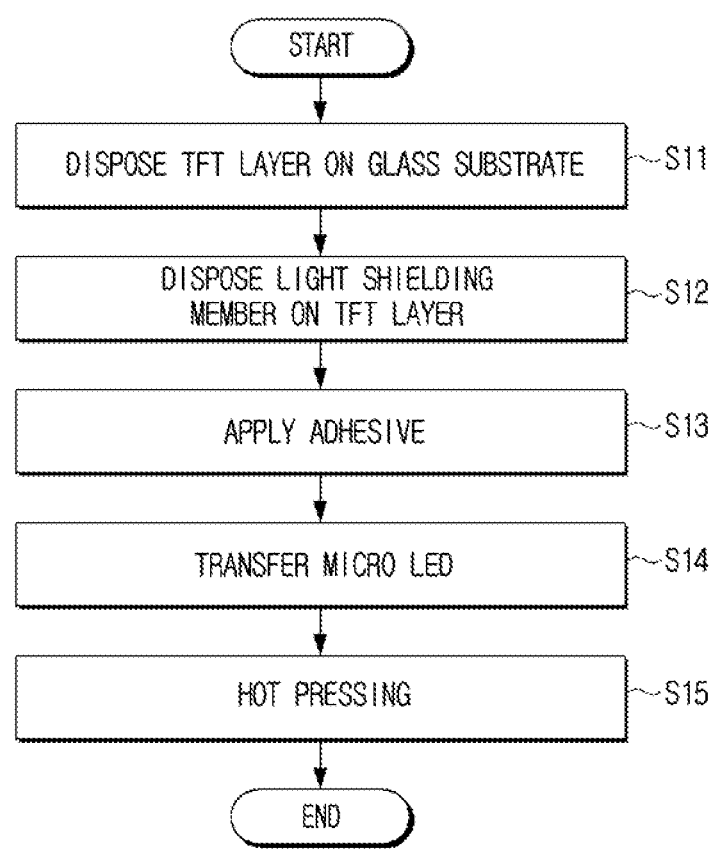
FIG. 4 is a flowchart of a method for manufacturing a display module according to an embodiment.

FIG. 4 is a flowchart of a method for manufacturing a display module according to an embodiment, and FIG. 5 through FIG. 11 are schematic views sequentially showing a method for manufacturing a display module according to an embodiment.

Figure 5:
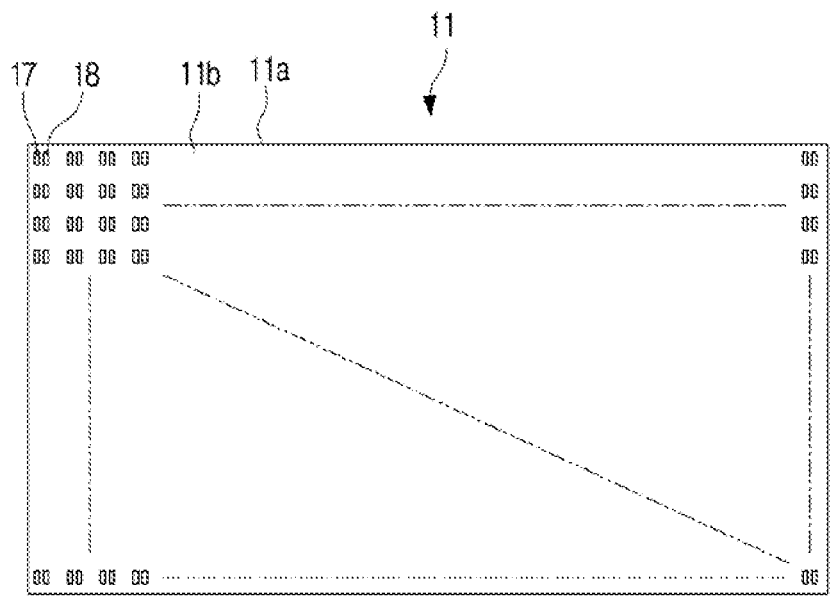
FIG. 5 is a sequential schematic view of a method for manufacturing a display module according to an embodiment.

Referring to FIG. 5, the transparent TFT layer 11*b* is disposed on one surface of the glass substrate 11*a* (S11). An insulation layer may be provided on a front surface of the TFT layer 11*b*, and the plurality of TFT electrode pads 17 and 18 may be arranged in lattice form so as to be exposed to the outside of the insulation layer.

Figure 6:
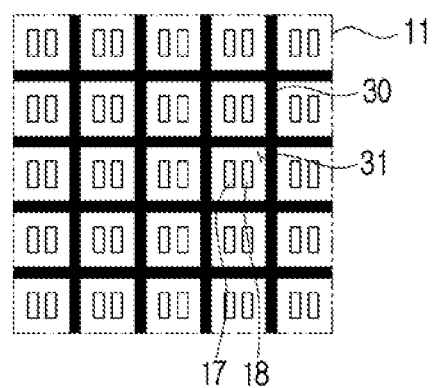
FIG. 6 is a sequential schematic view of the method for manufacturing the display module according to an embodiment.

Referring to FIG. 6, the light shielding member 30 for individually isolating the plurality of TFT electrode pads 17 and 18 which are arranged on the TFT layer 11*b* in lattice form may be disposed on the TFT layer 11*b* (S12).

The light shielding member 30 may be provided by applying a material constituting the light shielding member onto the TFT layer 11*b* so as to have even width and height using a dispenser. The light shielding member 30 may be printed on a thin transparent film by a method different from the above. In this case, the thin transparent film may be attached to the TFT layer 11*b* to dispose the light shielding member on the TFT layer 11*b*.

The light shielding member 30 may be provided in a mesh structure in which the plurality of openings 31 corresponding to the plurality of TFT electrode pads 17 and 18. Each opening 31 may be provided in the same shape and may be larger than the size of the micro LED while corresponding to the shape of the micro LED.

Figure 7:
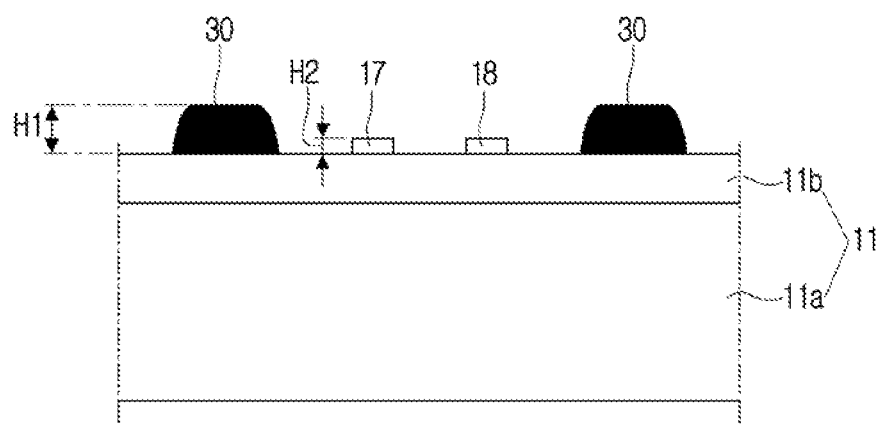
FIG. 7 is a sequential schematic view of the method for manufacturing the display module according to an embodiment.

Referring to FIG. 7, the height H1 of the light shielding member 30, with respect to the TFT layer 11*b*, may be higher than a height H2 of the TFT electrode pads 17 and 18, with respect to the TFT layer 11*b*.

Figure 8:
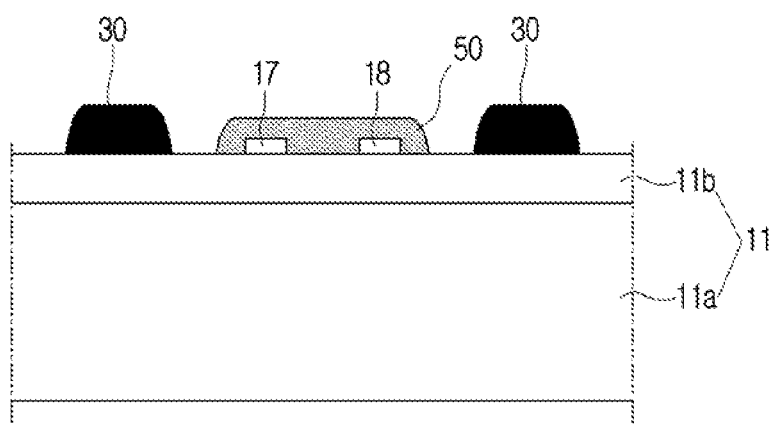
FIG. 8 is a sequential schematic view of the method for manufacturing the display module according to an embodiment.

Referring to FIG. 8, the adhesive member 50 may be applied to cover the TFT electrode pads 17 and 18 arranged on the TFT layer 11*b* (S13).

The adhesive member 50 may be applied in the opening so as not to be deviated from the opening 31. Accordingly, even if the fluidity of the adhesive member 50 increases due to the heat during the heat pressing process performed after the transfer process of the micro LED with respect to the TFT layer 11*b*, the adhesive member 50 may not overflow from the opening 31, because the adhesive member 50 is restrained by the light shielding member 30.

Figure 9:
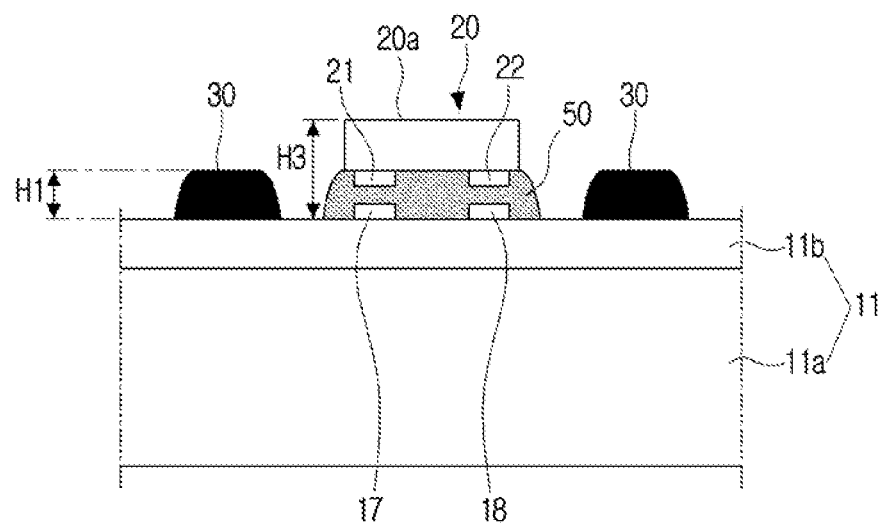
FIG. 9 is a sequential schematic view of the method for manufacturing the display module according to an embodiment.

Referring to FIG. 9, the plurality of micro LEDs 20 may be transferred to the TFT layer 11*b* (S14) by being transferred onto the adhesive member 50. The method for transferring the micro LEDs 20 may be a laser transfer method performed by a laser transfer device 100 which will be described later. However, the method for transferring the micro LEDs is not necessarily limited to the laser transfer method, and a pick-and-place transfer method, a stamping transfer method, a roll-based multi-transfer method, and the like may be applied.

The LED electrode pads 21 and 22 of the micro LED 20 transferred to the TFT layer 11*b* may be inserted into the adhesive member 50. In this case, the micro LED 20 may not come into contact with the corresponding TFT electrode pads 17 and 18. At that time, a height H3 of the micro LED 20 may be higher than the height H1 of the light shielding member 30.

Referring to FIG. 10, the plurality of micro LEDs 20 transferred to the TFT layer 11*b* may be heat pressed against the TFT layer 11*b* from the top of the TFT substrate 11 to bond the LED electrode pads 21 and 22 of each micro LED and the corresponding TFT electrode pads 17 and 18 to each other by the adhesive member 50 (S15).

The heat pressing may be performed through a separate pressurization member 60. The pressurization member 60 may move towards the TFT layer 11b from the top of the TFT substrate 11 and pressurize the plurality of micro LEDs 20 at the same time.

In the pressurization member 60, the pressurization surface 61 for pressurizing the plurality of micro LEDs 20 may be substantially flat to pressurize all of the micro LEDs 20 at uniform pressure.

During the heat pressing, the fluidity of the adhesive member 50 may increase due to the heat applied to the plurality of micro LEDs 20 and the TFT substrate 11, and accordingly, the shape thereof may be changed. The plurality of micro LEDs 20 may be pressed against the TFT substrate 11 by the pressurization member 60 and the LED electrode pads 21 and 22 and the TFT electrode pads 17 and 18 may come into contact with each other. The height H4 of the micro LED 20 may be lower than the height H3 which is the height before the heat pressing, but may be higher than the height H1 of the light shielding member 30.

Even if the fluidity of the adhesive member 50 increases due to the heat during the heat pressing, the adhesive member 50 may not overflow from the opening 31, because the adhesive member 50 is restrained by the light shielding member 30. In addition, the plurality of micro LEDs 20 may be guided by the light shielding member 30 so as not to be deviated from the transferred position (or bonding position) due to the pressure applied by the pressurization member 60.

In addition, a part of both LED electrode pads 21 and 22, the adhesive member 50, and a part of both TFT electrode pads 17 and 18 may be bonded to each other in a metal bonding state by heat pressing.

In addition, the shape of the adhesive member 50 may be changed due to the heat pressing so as to cover a part of the side surface 20*b* (e.g., lower part of the side surface) of the micro LED 20. Accordingly, the micro LED 20 may be more strongly fixed to the TFT substrate 11 by the adhesive member 50.

Figure 11:
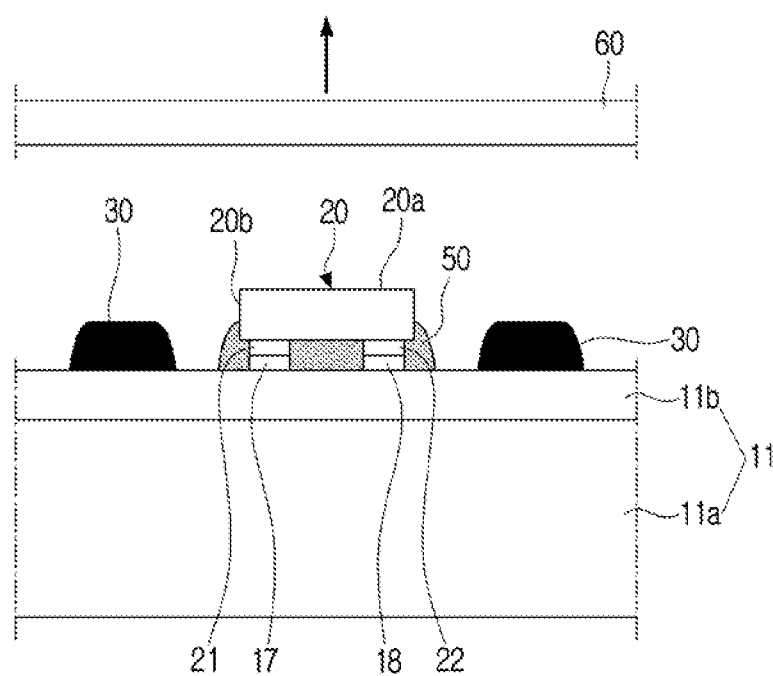
FIG. 11 is a sequential schematic view of the method for manufacturing the display module according to an embodiment.

Referring to FIG. 11, when the bonding process is completed, the pressurization member 60 may be lifted back to the original position.

Hereinafter, the laser transfer device 100 which may be used in the method for manufacturing the display module will be described with reference to the drawings.

Figure 12:
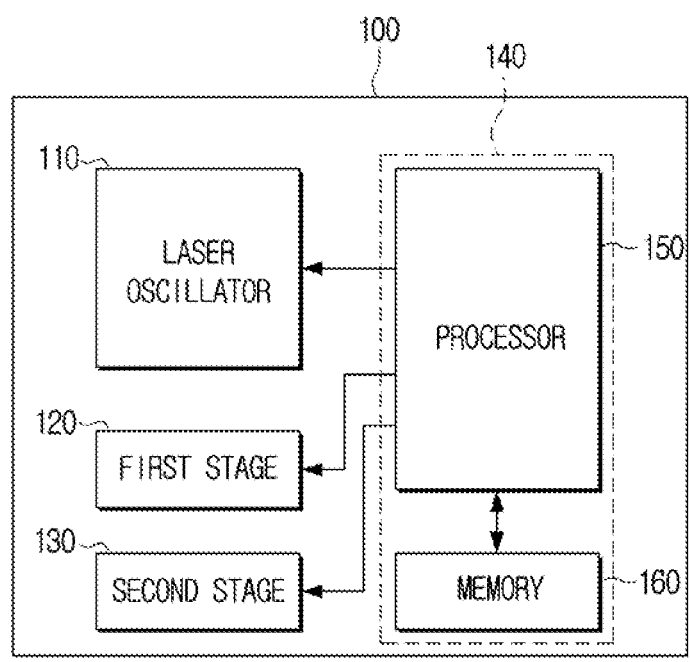
FIG. 12 is a block diagram of a laser transfer device according to an embodiment.
Figure 13:
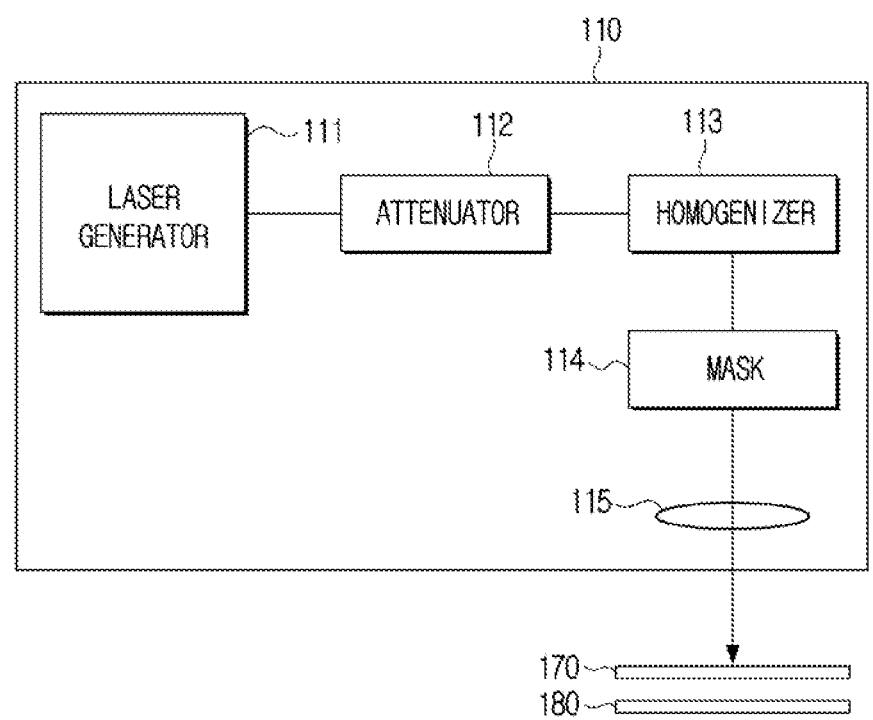
FIG. 13 is a block diagram of a laser oscillator of a laser transfer device according to an embodiment.

FIG. 12 is a block diagram schematically illustrating a laser transfer device according to an embodiment, and FIG. 13 is a block diagram schematically illustrating a laser oscillator of a laser transfer device according to an embodiment.

Referring to FIG. 12, the laser transfer device 100 may include a laser oscillator 110, a first stage 120, a second stage 130, and a controller 140 including a processor 150 and a memory 160.

The laser oscillator 110 may transfer a plurality of micro LEDs arranged on a transfer substrate to a target substrate by a laser lift off (LLO) method.

Referring to FIG. 13, the laser oscillator 110 may include a laser generator 111 for generating a laser beam, an attenuator 112 for attenuating an intensity of a laser beam output from the laser generator, a homogenizer 113 for forming the laser beam passed through the attenuator to have uniform distribution overall, a mask 114 for restricting the laser beam passed through the homogenizer to be emitted in a certain pattern, and a project lens (P-lens) 115 for reducing the pattern of the laser beam passed through the mask to be emitted to a transfer region of the transfer substrate. A plurality of mirrors for changing a passage of the laser beam may be disposed between the attenuator 112 and the homogenizer 113 and between the homogenizer 113 and the mask 114.

For the laser generator 111, various types of laser generators such as an excimer laser, a UV laser, and the like may be applied according to a wavelength of the laser beam.

The attenuator 112 and the homogenizer 113 may be disposed on the transfer path of the laser beam to adjust the intensity of the laser beam output from the laser generator 111.

If the excimer laser is used, the homogenizer 113 may homogenize the laser beam overall to provide uniform quality of the laser beam passing through the mask 114. The homogenizer 113 may perform the homogenization by dividing sunlight with a significant change in light intensity into small light sources and then superimposing on a target surface.

A plurality of slits forming a certain pattern may be provided on the mask 114. The laser beam may be provided in a certain pattern by passing through the plurality of slits of the mask 114. The pattern of the mask may be the same as the transfer pattern.

The P-lens 115 may focus the patterned laser beam passed through the mask 114 and emit the laser beam in the same pattern towards the transfer substrate 170 loaded on the first stage 120. The pattern of the laser beam emitted to the transfer substrate 170 may correspond to points where the plurality of light emitting diodes are disposed on the transfer substrate, for example, positions of the plurality of micro LEDs on the transfer position.

The transfer substrate 170 may be disposed on the lower side of the P-lens 115 at a certain distance. When the laser beam patterned through the P-lens 115 is emitted to the transfer substrate 170, the plurality of micro LEDs arranged on the transfer substrate 170 may be transferred to the target substrate 180 disposed on the lower side of the transfer substrate 170 at a certain distance.

Returning to FIG. 12, the first stage 120 may be disposed on the lower side of the laser oscillator 110 at a certain distance at the time of transfer. The first stage 120 may move along an X axis, a Y axis, and a Z axis by a first driving unit. The first stage 120 may be configured to move along guide rails that intersect each other in directions of the X axis and the Y axis and move in the Z axis direction together with the guide rail.

The first stage 120 may be provided at a random position so as not to be interfered by the laser oscillator 110 during loading and unloading operations of the transfer substrate 170.

The second stage 130 may be disposed on the lower side of the first stage 120 at a certain distance at the time of transfer. The second stage 130 may move along the X axis, the Y axis, and the Z axis by a second driving unit. The second stage 130 may be configured to move along guide rails that intersect each other in directions of the X axis and the Y axis and move in the Z axis direction together with the guide rail.

The second stage 130 may be provided at a random position so as not to be interfered by the laser oscillator 110 during loading and unloading operations of the target substrate 180.

The controller 140 may measure the positions of the first and second stages 120 and 130 in real time so that the substrates are disposed at accurate transfer position. The controller 140 may grasp the positions of the first and second stages 120 and 130 based on a rotation number and a driving time of a motor for moving the stages 120 and 130, a movement speed of the stages 120 and 130, and the like.

In addition, the controller 140 may further include a position measurement sensor for measuring the positions of the first and second stages 120 and 130 in a three dimensional space in real time. The position measurement sensor may include first and second position sensors provided for the first and second stages 120 and 130, respectively. The first position sensor may detect the position of the first stage 120 in a three-dimensional space. The second position sensor may detect the position of the second stage 130 in a three-dimensional space. The positions of the first and second stages 120 and 130 in the three-dimensional space may be represented as coordinates.

The controller 140 may calculate the movement speed of the first and second stages 120 and 130 in real time based on a rotation speed of the motor for moving each stage. Unlike the above embodiment, the controller 140 may further include a speed measurement sensor for sensing the movement speed of each stage. In this case, the speed measurement sensor include first and second speed sensors for measuring the movement speed of the first and second stages 120 and 130 in real time. The first speed sensor may measure the movement speed of the first stage 120 in real time. The second speed sensor may measure the movement speed of the second stage 130 in real time.

As described above, the movement speed of the first and second stages 120 and 130 detected in real time by the first and second speed sensors may be the basis for controlling the emission timing of the laser beam.

The controller 140 may include a memory 160 storing characteristic information of the plurality of light emitting diodes and a processor 150.

The processor 150 may control general operations of the laser transfer device 100. In other words, the processor 150 may be electrically connected to the laser oscillator 110 and the first and second stages 120 and 130 to control each component.

In other words, the processor 150 may determine positions on the target substrate 180 to which the plurality of light emitting diodes are to be transferred, based on the information stored in the memory 160, control the movement of the first and second stages 120 and 130 to move the transfer substrate 170 and the target substrate 180 to the transfer position, and control the laser oscillator 110 at the transfer position to emit the laser beam to a preset point of the transfer substrate 170.

In the previous description, all components are controlled by a single processor, but there is no limitation thereto, and each element of the laser transfer device 100 may be controlled by a plurality of independent processors. Here, the processor 150 may include one or more of a central processing unit (CPU), a controller, an application processor (AP), or a communication processor (CP), and an ARM processor.

The memory 160 may be implemented as at least one of a flash memory type, a ROM, a RAM, a hard disk type, a multimedia card micro type, and a card type memory (e.g., SD or XD memory). The memory 160 may be electrically connected to the processor 150 to transmit signals and information to the processor 150. The memory 160 may store information obtained by a flatness measurement sensor, a position measurement sensor, and a speed measurement sensor, and the processor 150 may access the information stored in the memory 160.

The plurality of micro LEDs arranged on the transfer substrate 170 may be transferred to the target substrate 180 through the laser transfer device 100, but there is no limitation to the laser transfer method, and the plurality of micro LEDs arranged on the transfer substrate 170 may also be transferred to the target substrate 180 by a pick-and-place transfer method, a stamping transfer method, a roll-based multi-transfer method, and the like.

A large format display (LFD) may be manufactured by arranging a plurality of display modules in a tile form. A seam between the display modules may be prevented from appearing by maintaining a pitch between pixels disposed on the outermost parts of the display modules adjacent to each other to be the same as a pitch between pixels in the single display module.

In addition, in the display module, side wirings of a thin film may be provided on edge portions of the display module in order to electrically connect the TFT circuit of the TFT layer provided on the front surface and the driving circuit provided on the rear surface.

While example embodiments of the disclosure have been shown and described, the disclosure is not limited to the aforementioned example embodiments, and it is apparent that various modifications can be made by those having ordinary skill in the technical field to which the disclosure belongs, without departing from the gist of the disclosure as defined by the appended claims. Also, it is intended that such modifications are not to be interpreted independently from the technical idea or prospect of the disclosure.

What is claimed is:

1. A display module comprising:
   a glass substrate;
   a thin film transistor (TFT) layer provided on a surface of the glass substrate, the TFT layer comprising a plurality of TFT electrode pads;
   a plurality of light emitting diodes (LEDs) provided on the TFT layer, each of the plurality of LEDs comprising LED electrode pads that are electrically connected to respective TFT electrode pads among the plurality of TFT electrode pads; and
   a light shielding member provided on the TFT layer and between the plurality of LEDs,
   wherein the light shielding member has a plurality of openings for individually isolating the plurality of LEDs,
   wherein a height of the light shielding member with respect to the TFT layer is lower than a height of the plurality of LEDs with respect to the TFT layer,
   wherein the LED electrode pads and the plurality of TFT electrode pads are electrically and physically connected to each other by an adhesive applied to the plurality of openings, and
   wherein the adhesive comprises flux particles, and the flux particles comprise one or more of: an inorganic flux containing zinc chloride and zinc chloride-ammonia chloride; an organic flux containing glutamic acid hydrochloride urea and ethylene diamine stearic acid hydrochloride; a rosin-based flux containing inactive/active rosin; or a water-soluble flux containing salt, acid, and amine.

2. The display module according to claim 1, wherein the height of the light shielding member with respect to the TFT layer is higher than a height of the TFT electrode pads with respect to the TFT layer.

3. The display module according to claim 1, wherein a size of each of the plurality of openings is larger than a size of each of the plurality of LEDs.

4. The display module according to claim 1, wherein the light shielding member has a mesh structure.

5. The display module according to claim 1, wherein the adhesive comprises anisotropic conductive paste or an anisotropic conductive film.

6. The display module according to claim 1, wherein the adhesive comprises a non-conductive paste or a non-conductive film.

7. The display module according to claim 1, wherein each of the LED electrode pads comprises a stacked structure of a first layer and a second layer,
   wherein the first layer comprises one of Au, Cu, Ni, or Al, and
   wherein the second layer comprises one of Au, Ni, Ti, Cr, Pd, TiN, Ta, TiW, TaN, AlSiTiN, NiTi, TiBN, ZrBN, TiAlN, or TiB2.

8. The display module according to claim 7, wherein the TFT electrode pads comprise one of Au, Cu, Ag, Ni, Ni/Au, Au/Ni, Ni/Cu, or Cu/Ni.

9. The display module according to claim 8, wherein the adhesive is melted together with the second layer of the LED electrode pads and the TFT electrode pads to form a metal compound.

10. The display module according to claim 9, wherein the adhesive consists essentially of Sn or In.

11. The display module according to claim 9, wherein the adhesive comprises two or more of Sn, Ag, In, Cu, Ni, Au, Cu, Bi, Al, Zn, or Ga.

12. A display module comprising:
    a glass substrate;
    a thin film transistor (TFT) layer provided on a surface of the glass substrate, the TFT layer comprising a plurality of TFT electrode pads;
    a plurality of light emitting diodes (LEDs) provided on the TFT layer, each of the plurality of LEDs comprising LED electrode pads that are electrically connected to respective TFT electrode pads among the plurality of TFT electrode pads; and
    a light shielding member provided on the TFT layer and between the plurality of LEDs,
    wherein a height of the light shielding member with respect to the TFT layer is lower than a height of the plurality of LEDs with respect to the TFT layer, and
    wherein the light shielding member comprises:
       a photosensitive resin composition comprising a binder resin, a photopolymerization initiator, a black pigment, and a solvent; or
       a resin composition including a black pigment.

13. A display module comprising:
    a glass substrate;
    a thin film transistor (TFT) layer provided on a surface of the glass substrate, the TFT layer comprising a plurality of TFT electrode pads;
    a plurality of light emitting diodes (LEDs) provided on the TFT layer, each of the plurality of LEDs comprising LED electrode pads that are electrically connected to respective electrode pads among the plurality of TFT electrode pads;
    a light shielding member provided on the TFT layer as a mesh structure having a plurality of openings, the light shielding member having a height with respect to the TFT layer that is lower than a height of the plurality of LEDs with respect to the TFT layer; and
    an adhesive provided in the plurality of openings and electrically and physically connecting the LED electrode pads and the plurality of TFT electrode pads to each other, wherein the adhesive comprises flux particles, and the flux particles comprise one or more of: an inorganic flux containing zinc chloride and zinc chloride-ammonia chloride, an organic flux containing glutamic acid hydrochloride urea and ethylene diamine stearic acid hydrochloride, a rosin-based flux containing inactive/active rosin, or a water-soluble flux containing salt, acid, and amine.

14. The display module according to claim 13, wherein the adhesive comprises one of anisotropic conductive paste, anisotropic conductive film, non-conductive paste, or non-conductive film.

* * * * *